United States Patent [19]

Hawrylo

[11] 4,214,550
[45] Jul. 29, 1980

[54] APPARATUS FOR THE DEPOSITION OF A MATERIAL FROM A LIQUID PHASE

[75] Inventor: Frank Z. Hawrylo, Trenton, N.J.

[73] Assignee: RCA Corporation, New York, N.Y.

[21] Appl. No.: 41,087

[22] Filed: May 21, 1979

[51] Int. Cl.² .................... H01L 21/208; B05C 3/18
[52] U.S. Cl. ................................. 118/712; 118/412; 118/415
[58] Field of Search .............. 118/666, 667, 712, 412, 118/415, 422; 156/621, 622, 624; 148/171, 172

[56] References Cited

U.S. PATENT DOCUMENTS

| | | | |
|---|---|---|---|
| 3,565,702 | 2/1971 | Nelson | 156/622 X |
| 3,632,431 | 1/1972 | Andre et al. | 156/622 X |
| 3,783,825 | 1/1974 | Kobayasi et al. | 118/422 |
| 3,791,887 | 2/1974 | Deitch | 148/172 |
| 3,909,317 | 9/1975 | Itoh et al. | 148/171 |
| 3,933,538 | 1/1976 | Akai et al. | 148/171 |
| 3,972,753 | 8/1976 | Legros et al. | 118/415 X |
| 4,072,544 | 2/1978 | Dewinter et al. | 148/171 |

OTHER PUBLICATIONS

Electronics Letters, vol. 8, No. 1, Jan. 13, 1972, pp. 16 and 17.

Primary Examiner—John P. McIntosh
Attorney, Agent, or Firm—Birgit E. Morris; Donald S. Cohen

[57] ABSTRACT

An apparatus for depositing one or more layers of a material on a substrate by liquid phase epitaxy includes in a furnace tube a furnace boat having a plurality of wells in its upper surface and a substrate-carrying slide movable through the boat and across the wells to bring the substrate into the wells. Over and along the top surface of the boat is an elongated, hollow support rod which is rotatable about its longitudinal axis. A plurality of cup-shaped containers are mounted on or secured to the support end. The containers are positioned along the support rod 30 that each container is over a separate well in the furnace boat. A thermocouple is within and movable along the support rod.

6 Claims, 1 Drawing Figure

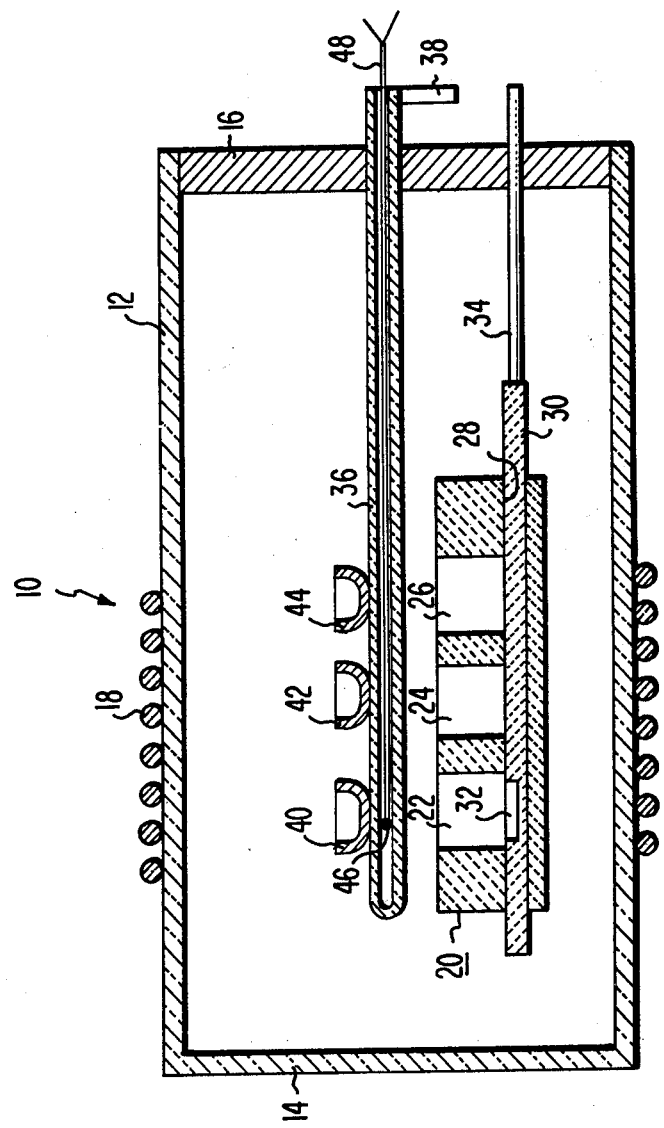

APPARATUS FOR THE DEPOSITION OF A MATERIAL FROM A LIQUID PHASE

BACKGROUND OF THE INVENTION

The present invention relates to an apparatus for use in the deposition of a material, particularly a semiconductor material, from a liquid phase, e.g. liquid phase epitaxy. More particularly, the present invention relates to such an apparatus which includes temperature measuring means for achieving control of the saturation of the liquid with the material to be deposited.

One technique for depositing a single crystalline material on a substrate is liquid phase epitaxy. To carry out the deposition of a material by liquid phase epitaxy the material to be deposited is dissolved in a heated solvent, generally a molten metal, and the substrate is brought into contact with the solution. The solution is then cooled causing some of the material to be precipitated out of the solution and deposited on the surface of the substrate. To deposit a plurality of superimposed layers on a substrate, a type of apparatus has been developed which includes a furnace boat having a plurality of spaced wells therein, each of which is adapted to contain a deposition solution. A substrate carrying slide is movable through the furnace boat so as to bring the substrate into contact with the solution in each of the wells. U.S. Pat. No. 3,565,702 to H. Nelson, entitled "DEPOSITING SUCCESSIVE EPITAXIAL SEMICONDUCTIVE LAYERS FROM THE LIQUID PHASE", issued Feb. 23, 1971, shows one type of such a furnace boat in which the wells are arranged in a line and the slide moves longitudinally through the furnace boat and across the wells. There are other types of furnace boats in which the wells are arranged in a circle and the substrate carrying slide is rotated to carry the substrate into each of the wells.

For making various types of semiconductor devices by liquid phase epitaxy it is often desirable that the solution be exactly saturated with the semiconductor material at the time that the substrate is brought into contact with the solution. Another factor which must be controlled in the deposition of the layers of the material is the amount of the material in the solution in order to deposit a layer of a desired thickness. Thus, knowing the amount of material which must be dissolved in the solution to deposit a layer of a desired thickness, it is desirable to be able to determine when the solvent is at the temperature at which it will be exactly saturated with that amount of the material. This temperature is sufficiently critical that merely measuring the temperature of the furnace which contains the furnace boat is not adequate for determining the temperature of the solution.

SUMMARY OF THE INVENTION

The present invention relates to an improvement in an apparatus for epitaxially depositing at least one layer of a material on a substrate from a liquid phase which apparatus includes a furnace boat having at least one well for containing a deposition solution. The improvement includes a container for an additive to the deposition solution, support means supporting the container over the well in the furnace boat and adapted to move the container to a position whereby the additive is dropped into the well, and means in the support for measuring the temperature of the solution in the container.

BRIEF DESCRIPTION OF THE DRAWING

The FIGURE of the drawing is a sectional view of one form of a deposition apparatus which includes the present invention.

DETAILED DESCRIPTION

Referring to the drawing, one form of a deposition apparatus which incorporates the present invention is generally designated as 10. The deposition apparatus 10 includes a furnace tube 12 having one closed end 14 and a removable cover 16 at its other end. The furnace tube 12 is provided with means for heating the interior of the tube, such as a resistance heater 18 surrounding the furnace tube 12.

Within the furnace tube 12 is a furnace boat 20. The furnace boat 20 is of the type shown and described in U.S. Pat. No. 3,565,702. The furnace boat 20 comprises a body of an inert refractory material, such as graphite, having three wells 22, 24 and 26 in its upper surface. The furnace boat 20 has a passage 28 extending longitudinally therethrough from one end of the furnace boat to the other and across the bottoms of the three wells 22, 24 and 26. A slide 30 of a refractory material, such as graphite, extends through and is movable within the passage 28. The top surface of the slide 30 is coplanar with the bottom of the wells 22, 24 and 26. The slide 30 has a recess 32 in its top surface which is adapted to receive a substrate on which the layers are to be epitaxially deposited. The recess 32 is positioned so that it will enter each of the wells 22, 24 and 26 as the slide 30 is moved along in the passage 28. A rod 34 is connected to one end of the slide 30 and extends through the cover 16 of the furnace tube 12 so as to permit movement of the slide 30 from outside the furnace tube 12.

An elongated, hollow support rod 36 extends over and along the top surface of the furnace boat 20. The support rod 36 is of an electrical insulating, refractory material, such as a high temperature glass. The support rod 36 is of a length to extend through the cover 16 of the furnace tube 12 and is rotatably supported in the cover 16 so that it can be rotated about its longitudinal axis. A handle 38 may be provided on the end of the support rod outside of the furnace tube 12 so as to permit rotation of the support rod. Three containers 40, 42 and 44 are mounted in spaced relation along the support rod 36. Each of the containers 40, 42 and 44 is cup-shaped and has its bottom seated on and secured to the support rod 36. The containers 40, 42 and 44 are positioned along the support rod 36 so as to be directly over the wells 22, 24 and 26, respectively in the furnace boat 20. A temperature measuring device 46, such as a thermocouple, is within the support rod 36. The thermocouple 46 is mounted on a rod 48 which extends through the support rod 36 and beyond the open end of the support rod 36 so as to permit the thermocouple 46 to be moved along the support rod 36 from outside the furnace tube 12.

In the operation of the deposition apparatus 10, for depositing one or more layers of a material on a substrate, a solvent for the material to be deposited is placed in one or more of the wells 22, 24 and 26 with each well being used to deposit a separate layer. For depositing a semiconductor material, such as a Group III-V compound or alloy thereof, the solvent is generally a low melting metal, such as gallium or indium.

With the slide 30 being positioned so that the recess 32 is outside the furnace boat 20, the substrate (not shown) on which the layer or layers is to be deposited is placed in the recess 32. With the support rod 36 being rotated so that the containers 40, 42 and 44 are facing upwardly, additives in the form of the material to be deposited is placed in the containers. The furnace tube 12 is then heated to melt the solvent. When the solvent has been heated to the temperature at which the amount of additive in the container will saturate the solvent, the support rod 36 is rotated to move the container to a position whereby the additive is dropped into the solvent. By moving the rod 48 so as to bring the thermocouple 46 directly under a container and over a well, the temperature of the additive in the container and the solvent in the well can be accurately measured. Thus, the timing of the adding of the additive to the solvent can be controlled accurately to achieve the desired saturation of the solvent with the additive.

Once the solutions of the deposition material and the solvent is formed in the wells, the material is deposited on the substrate in the manner described in U.S. Pat. No. 3,565,702. This is achieved by moving the slide 30 so as to bring the substrate into each of the wells in succession. While the substrate is in the well and in contact with the solution in the well, the temperature of the furnace boat and its contents is lowered to cause some of the material in the solution to precipitate out of the solution and deposit on the surface of the substrate.

I claim:

1. In an apparatus for epitaxially depositing at least one layer of a material on a substrate from a liquid phase which includes a furnace boat having at least one well for containing a deposition solution, the improvement comprising:

a container for containing an additive for the deposition solution, support means supporting said container over the well of the furnace boat and adapted to move said container to a position whereby the additive can enter the well in the furnace boat, and means in said support means for measuring the temperature of the additive in the container and the deposition solution in the adjacent well.

2. An apparatus in accordance with claim 1 in which the furnace boat has a plurality of wells therein, and a plurality of containers are supported on said support means to permit the addition of an additive material to the deposition solution in each of the wells.

3. An apparatus in accordance with claim 2 in which the means for measuring the temperature of the additive in the container is movable along the support means so as to permit the measurement of the additive in each container.

4. An apparatus in accordance with claim 3 in which the support means in an elongated rod and the containers are cup-shaped and are secured in aligned space relation along the rod.

5. An apparatus in accordance with claim 4 in which the rod is mounted over and along the top of the furnace boat so as to be rotatable about the longitudinal axis of the rod.

6. Apparatus in accordance with claim 3 in which the rod is hollow and the temperature measuring means is a thermocouple within and movable along the rod.

* * * * *